United States Patent [19]
Holder

[11] Patent Number: 5,919,303
[45] Date of Patent: Jul. 6, 1999

[54] PROCESS FOR PREPARING A SILICON MELT FROM A POLYSILICON CHARGE

[75] Inventor: John Davis Holder, Lake St. Louis, Mo.

[73] Assignee: MEMC Electronic Materials, Inc., St. Peters, Mo.

[21] Appl. No.: 08/951,264

[22] Filed: Oct. 16, 1997

[51] Int. Cl.$^6$ ............................................. C30B 15/00
[52] U.S. Cl. ............................... 117/13; 117/18; 117/33
[58] Field of Search .............................. 117/13, 18, 33, 117/2, 21, 932

[56] References Cited

U.S. PATENT DOCUMENTS

| | | | |
|---|---|---|---|
| 4,249,988 | 2/1981 | Lavigna et al. | 156/605 |
| 5,037,503 | 8/1991 | Kajimoto et al. | 156/620.1 |
| 5,242,531 | 9/1993 | Klingshirn et al. | 117/21 |
| 5,340,434 | 8/1994 | Takano et al. | 117/21 |
| 5,415,125 | 5/1995 | Fujita et al. | 117/17 |
| 5,588,993 | 12/1996 | Holder | 117/13 |

FOREIGN PATENT DOCUMENTS 5-270969  10/1993  Japan .

OTHER PUBLICATIONS

F. Shimura "Semiconductor Silicon Crystal Technology" Academic Press, San Diego, CA (1989) pp. 116–121 & 175–183.

*Primary Examiner*—Benjamin Utech
*Assistant Examiner*—Kin-Chan Chen
*Attorney, Agent, or Firm*—Senniger, Powers, Leavitt & Roedel

[57] ABSTRACT

A process for preparing a silicon melt from a polysilicon charge, for use in the production of single crystal silicon ingots by the Czochralski method, in a crucible which has a bottom, a sidewall formation, a centerline which is substantially parallel to the sidewall formation and which intersects a geometric centerpoint of the bottom, and a radius extending from the centerline to the sidewall formation. In the process, the crucible is loaded with chunk polysilicon to form a charge having a bowl-like shape, wherein initially the load generally slopes radially upwardly and outwardly from the centerline toward the sidewall formation to an apex and then slopes generally downwardly and outwardly from the apex to the sidewall formation. The bowl-shaped chunk polysilicon charge is heated to form a partially melted charge, and granular polysilicon is fed onto the partially melted charge to form a mixed charge of chunk and granular polysilicon. As the mixed charge is further heated to form a silicon melt, the unmelted chunk polysilicon present above the melt surface acts to deflect any molten silicon that may be splattered as granular polysilicon rapidly melts and hydrogen is released.

21 Claims, 6 Drawing Sheets

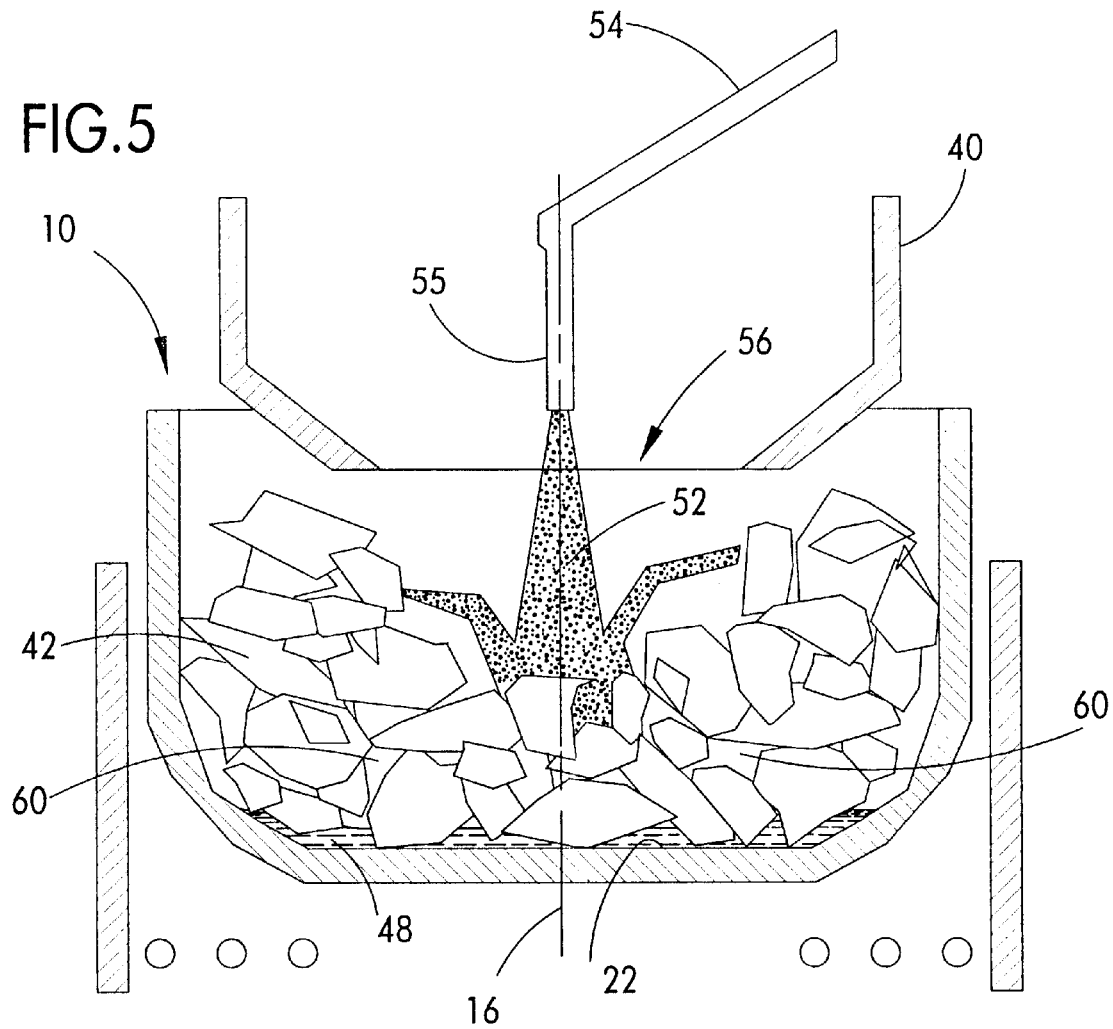

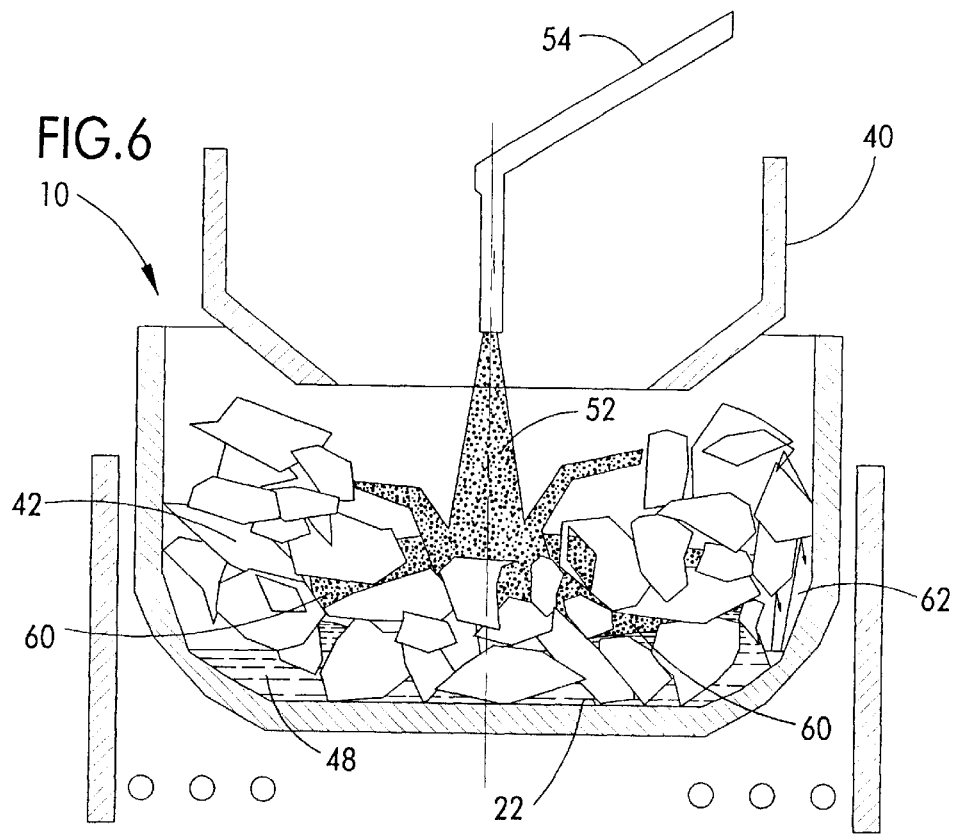
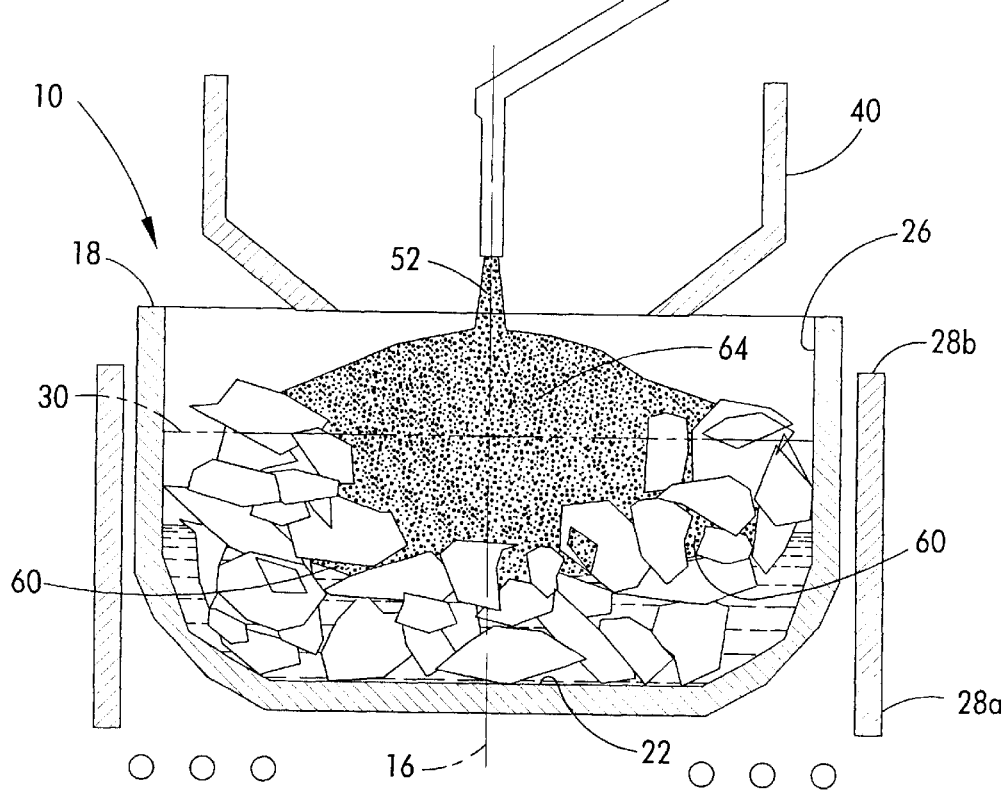

PROCESS FOR PREPARING A SILICON MELT FROM A POLYSILICON CHARGE

BACKGROUND OF THE INVENTION

The present invention generally relates to the production of single crystal silicon from a molten silicon melt. More particularly, the invention relates to a process for preparing a molten silicon melt from a mixed charge of chunk and granular polycrystalline silicon, wherein chunk polycrystalline silicon is loaded to form a bowl-like shape onto which the granular polycrystalline silicon is added.

Most single crystal silicon used for microelectronic circuit fabrication is prepared by the Czochralski ("Cz") process. In this process, a single crystal silicon ingot is produced by melting polycrystalline silicon ("polysilicon") in a crucible, dipping a seed crystal into the molten silicon, withdrawing the seed crystal in a manner sufficient to achieve the diameter desired for the ingot, and growing the single crystal at that diameter.

The polysilicon melted to form the molten silicon is typically chunk polysilicon which is prepared by the Siemens process. Chunk polysilicon is generally irregular in shape, having sharp, jagged edges as a result of the fact that it is prepared by breaking rods of polysilicon into smaller pieces which typically range from about 2 cm to about 10 cm in length and from about 4 cm to about 6 cm in width. Alternatively, granular polysilicon, which is a form of polysilicon that is much smaller than the chunk and which has a generally uniform, spherical shape can be used to form the melt. Granular polysilicon is typically prepared by a relatively more simple and efficient fluidized-bed reaction process. Granular polysilicon is typically about 1–5 mm in diameter and generally has a packing density which is about 20% higher than chunk polysilicon. The preparation and characteristics of both chunk and granular polysilicon are further detailed in F. Shimura, *Semiconductor Silicon Crystal Technology*, pages 116–121, Academic Press (San Diego Calif., 1989) and the references cited therein.

Following a typical Cz process, the crucible is initially charged, or loaded, entirely with chunk polysilicon. However, loading a crucible in this manner can cause problems in the subsequent manufacture of the single crystal silicon ingot. For example, the edges of chunk polysilicon are typically sharp and jagged. As a result, under the weight of a full charge the chunks can scratch or gouge the crucible wall and, in particular, the bottom of the crucible. These scratches and gouges can cause damage to the crucible such that small particles of the crucible are actually broken away from the crucible surface. These small particles then become suspended in the silicon melt, and can ultimately become incorporated into the growing crystal. The presence of these small particles thus significantly increases the likelihood of forming dislocations within the single crystal, and decreases production yields and throughput of dislocation-free single crystals.

As melting of the polysilicon charge proceeds, the lower portion of the chunk polysilicon can melt away and leave a "hanger" of unmelted material stuck to the crucible wall above the melt. Alternatively, a "bridge" of unmelted material can form which extends between opposing sides of the crucible wall and over the melt. If a hanger or a bridge collapses, it may cause molten silicon to be splattered, or cause mechanical stress damage to the crucible. These same problems can also be caused simply by a shift in the chunk polysilicon charge as melting proceeds.

In addition to the damage that can result to the crucible, initially loading the crucible with 100% chunk polysilicon limits the volume of material which can be charged due to the poor packing densities of such material. This volume limitation also directly impacts production yields and throughput of dislocation-free single crystals.

Although granular polysilicon offers advantages over chunk polysilicon with respect to preparation and packing density, full capacity charging of granular polysilicon into the crucible and the melting thereof can also introduce undesirable impurities and defects into the single crystal. For example, large amounts of power are required in order to melt the granular polysilicon due to its low thermal conductivity, a problem that can be magnified by the cooling effects of purge gas systems which are often employed in crystal pullers today. The thermal stress induced in the crucible by exposure to such high meltdown power can cause distortion of the crucible and result in the introduction of particles of the crucible wall into the melt, which can ultimately become incorporated into the single crystal. Like mechanical stresses, these thermal stresses result in reduced production yields and throughput of dislocation-free crystals.

Kim et al. suggest, in U.S. patent application Ser. No. 08/595,075, thermally shielding the granular polysilicon from the cooling effects of the purge gas by loading chunk polysilicon onto the granular polysilicon. Such an approach favorably acts to limit the potential for thermal stress to the crucible by lowering the heater power level required in order to melt the charge. However, the potential increases for the formation of voids in the single crystal grown from such a melt.

Whether the crucible is initially loaded with chunk or granular polysilicon, in many processes it is desired to add polysilicon to the melt with a feeding or metering system to increase the quantity of molten silicon. The use of such additional loadings of "charge-up" polysilicon is known for batch, semi-continuous or continuous process systems. In the batch system, for example, additional silicon may be loaded into the existing melt to achieve full crucible capacity because of the decrease in volume which occurs after the initial polysilicon charge is melted. Japanese Utility Model Application No. 50-11788 (1975) is exemplary. In semi-continuous and continuous Czochralski systems, additional polysilicon is charged to the silicon melt to replenish the silicon withdrawn as the single crystal silicon ingot is grown. See, e.g., F. Shimura, *Semiconductor Silicon Crystal Technology*, p. 175–83, Academic Press (San Diego Calif., 1989).

Although granular polysilicon is generally the material of choice to replenish batch, semi-continuous and continuous Czochralski systems because of its free-flowing form, it is not without disadvantages. As disclosed by Kajimoto et al. in U.S. Pat. No. 5,037,503, granular polysilicon prepared by the silane process contains hydrogen in an amount sufficient to cause the silicon granules to burst, or explode, when they are immersed in molten silicon. The explosion, or bursting, of the polysilicon granules causes molten silicon droplets to splatter. These droplets can accumulate on the surface of the crucible and other components in the crystal puller, where they can later fall back into the molten silicon melt and interfere with crystal growth.

As a solution to this problem, Kajimoto et al. suggest reducing the hydrogen content of the granular polysilicon by preheating the granular polysilicon in an inert gas atmosphere in a separate heating apparatus until the concentration of $H_2$ is 7.5 ppm by weight (210 ppma) or less. While this approach tends to reduce the force with which the granules explode, it does not eliminate the phenomena. In fact, the bursting phenomena can still be experienced with granular polysilicon having a hydrogen concentration of less than 1 ppm by weight (28 ppma).

An alternative solution to this problem is suggested in U.S. Pat. No. 5,588,993, wherein chunk polysilicon is partially melted and then granular polysilicon is fed onto the exposed, unmelted portion of the chunk polysilicon. The granular polysilicon is fed at a rate which allows for it to reach a temperature greater than about 1200° C. and remain at this temperature for about 30 seconds before melting. Heating the granular polysilicon in this way allows for it to be dehydrogenated before becoming immersed in the molten silicon melt.

The problem with such an approach is that, in order to avoid the effects associated with the hydrogen bursting phenomena, granular polysilicon must be fed at a rate which is slow enough to allow for dehydrogenation before melting occurs. This can cause the process time required to prepare a 100 kg molten silicon melt to be about 10 hours, thus acting to reduce crystal puller throughput, especially as the average hydrogen content of the granular polysilicon feed exceeds about 10 ppma.

The problems associated with the bursting of granular polysilicon and the resultant splattering of molten silicon associated with it becomes a much more significant problem when crystal pullers having complex hot zone designs are used. Such designs, wherein purge gas systems are employed and graphite shielding is present above the crucible, are becoming more prevalent in the production of single crystals because crystals having superior properties can be obtained. However, such designs provide additional opportunities for the introduction of defects into the growing crystal because more surfaces are present above the melt, where splattered silicon particles can accumulate and eventually fall back into the melt.

As a result, a need continues to exist for a process whereby silicon melts can be prepared in hot zones of complex design in a manner that prevents the splattering of silicon particles, while improving the throughput and yield of dislocation-free single crystal silicon ingots produced from these melts.

SUMMARY OF THE INVENTION

Among the objects of the present invention, therefore, is the provision of a process for preparing a molten silicon melt suitable for improving the production yield and throughput of a dislocation-free single crystal silicon ingot, by decreasing the mechanical and thermal stresses on the crucible, minimizing the concentration of hydrogen in the melt, minimizing the presence of voids in the single crystal caused by the presence of argon at the bottom of the crucible, maximizing the volume of polysilicon in the initial loading, and avoiding hydrogen bursting effects during the addition of granular polysilicon. Additional objects include the provision of a process for preparing a molten silicon melt suitable for producing a single crystal silicon ingot having improved dislocation-free growth and throughput without adding significant additional process costs, equipment or time. Yet another object of the present invention is to achieve the foregoing in crystal pullers having hot zones of complete design.

Briefly, therefore, the present invention is directed to a process for preparing a molten silicon melt, for use in growing a single crystal silicon ingot in accordance with the Czochralski method, in a crucible which has a bottom, a sidewall formation, a centerline which is substantially parallel to the sidewall formation and which intersects a geometric centerpoint of the bottom, and a radius extending from the centerline to the sidewall formation. The process is characterized in that the crucible is loaded with chunk polysilicon to form a charge having a bowl-like shape, wherein initially the load generally slopes radially upwardly and outwardly from the centerline toward the sidewall formation to an apex and then slopes generally downwardly and outwardly from the apex to the sidewall formation. The bowl-shaped chunk polysilicon charge is heated to form a partially melted charge. Granular polysilicon is fed onto the partially melted charge to form a mixed charge of chunk and granular polysilicon. The mixed charge is further heated to form a silicon melt.

The process is further characterized in that a portion of the granular polysilicon passes through spaces present between the unmelted chunks of polysilicon until it contacts the surface of the molten silicon melt. The granular polysilicon which comes into contact with the molten silicon melts rapidly, resulting in the rapid release of hydrogen. The unmelted chunk polysilicon present above the melt acts to deflect any molten silicon that may be splattered.

The process is still further characterized in that granular polysilicon addition is continued until a cap of granular polysilicon is formed which covers the chunk polysilicon which has not melted. As the mixed polysilicon charge below the cap melts, the cap acts to deflect any splattering of molten polysilicon that may occur. In addition, the temperature of the granular polysilicon comprising the cap is increased to a level for a period of time which is sufficient to effectively dehydrogenated it prior to it coming into contact with the molten silicon melt.

Other objects and features of this invention will be in part apparent and in part pointed out hereinafter.

BRIEF DESCRIPTION OF THE DRAWINGS

FIG. 5 is a sectional view of a Czochralski crucible, showing the initial stage of granular polysilicon addition.

FIG. 6 is a sectional view of a Czochralski crucible, showing the continued addition of granular polysilicon and the passing of granular polysilicon through spaces which exist between the polysilicon chunks.

FIG. 7 is a sectional view of a Czochralski crucible, showing the formation of a granular polysilicon cap as the addition of granular polysilicon continues and the spaces between the polysilicon chunks are filled.

DETAILED DESCRIPTION OF THE INVENTION

Figure 1:
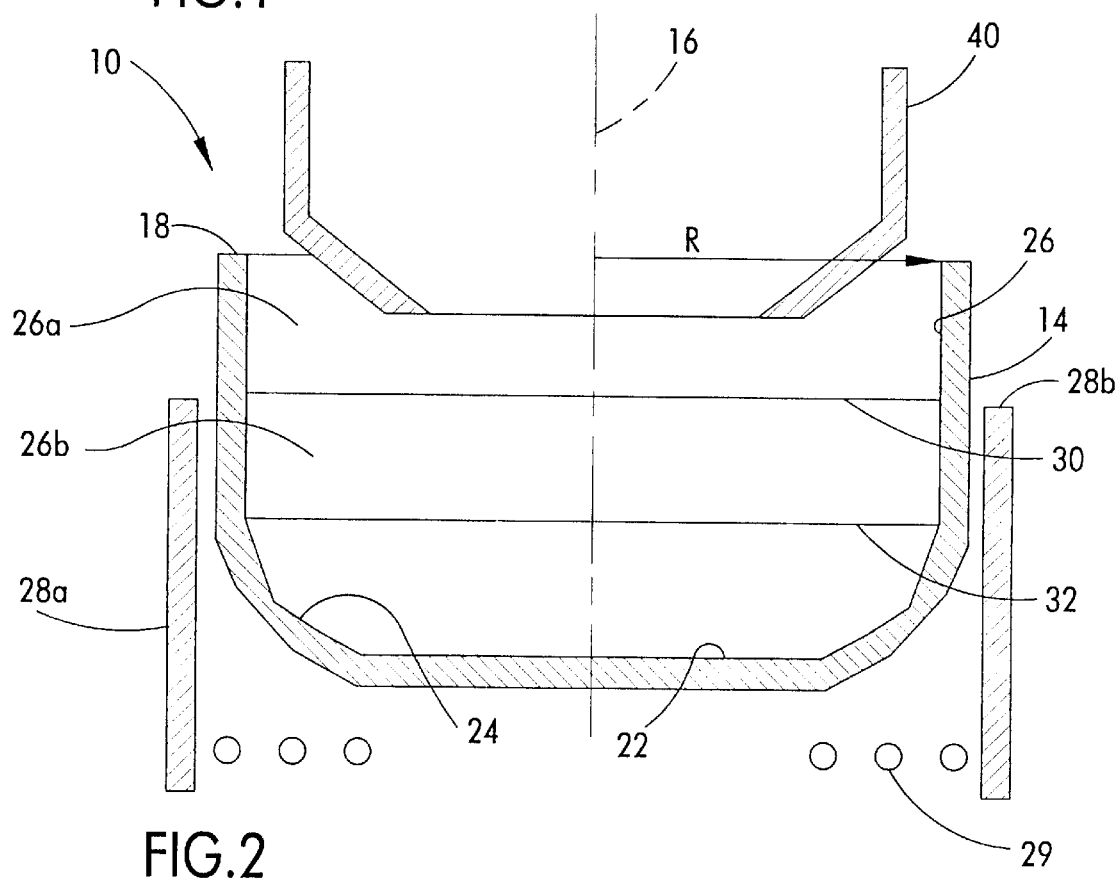
FIG. 1 is a sectional view of an empty Czochralski crucible.

In accordance with the process of the present invention, chunk polysilicon is initially loaded into a Czochralski crucible and melted to form a partially melted charge which includes both molten silicon and unmelted chunk polysilicon. While the particular geometry of the crucible is not narrowly critical, it will generally have inner and outer surfaces which define an at least partially open structure capable of containing or otherwise holding a liquid such as molten silicon. Referring now to FIG. 1, an exemplary silica crucible 10 generally has an inner surface 12, an outer surface 14, a centerline 16 and a top edge 18. The inner surface 12 defines an open cavity into which chunk polysilicon is loaded. The crucible 10 includes a bottom portion 22, a corner portion 24 and a sidewall formation 26, referred to hereinafter as the bottom 22, corner 24 and sidewall 26, respectively of the crucible. The crucible has a radius R, as measured from the centerline 16 radially outwardly to the inner surface of sidewall 26. The crucible 10 is surrounded by a cylindrical side heater 28a, having a top edge 28b, and a bottom heater 29 which are used to melt the charge.

In this illustrated embodiment, the sidewall 26 is generally vertical, defining a substantially vertical circumferential area which includes a top portion 26(a) and a bottom portion 26(b), the top and bottom portions 26(a), 26(b) each including about 50% of the total surface area of the sidewall. The approximate division between the top and bottom portions is generally illustrated by line 30. The bottom 22 is generally parabolic, having a slope with a substantially greater horizontal component than vertical component. The corner 24 is a curved annular boundary region in the vicinity of the intersection of the sidewall 26 and bottom 22. The corner 24 intersects the sidewall 26 where the curvature of the corner ceases, illustrated generally as line 32. The corner 24 has upper and lower halves each of which include about half of the total surface area of the corner, with the upper half being closer to the sidewall 26 and the lower half being closer to the bottom 22. The centerline 16 of the crucible 10 is substantially parallel to the sidewall 26 and intersects a geometric centerpoint of the bottom 22.

The process of the present invention is optimally suited for use in crystal pullers having hot zones of complex design wherein, for example, insulation, gas purge tubes, and/or heat reflectors are positioned above the crucible in order to help ensure crystal pulling temperatures are maintained within preferred ranges. One embodiment of a hot zone having such a complex design is depicted in FIG. 1, wherein a heat reflector 40 is positioned above the crucible 10. It is to be noted that the design of the hot zone, as well as the materials from which it is constructed, can be other than that which is herein described without departing from the scope of the process of the present invention.

For the initial loading of the crucible, chunk polysilicon, having irregular shapes, is preferred over the smaller, more uniform granular polysilicon. This is because the initial use of granular polysilicon can result in relatively poor production yields and a high incidence of large void defects forming in the single crystal silicon ingot. Without being held to any particular theory, it is believed that the granular polysilicon traps gasses such as argon or hydrogen at the bottom of the crucible, and that these gasses are later released as bubbles into the silicon melt during crystal growth. Some of the bubbles can become attached to the crystal at the growth interface, thus forming void defects. The use of chunk polysilicon for the initial loading avoids the formation of these defects and generally results in higher yields.

Figure 2:
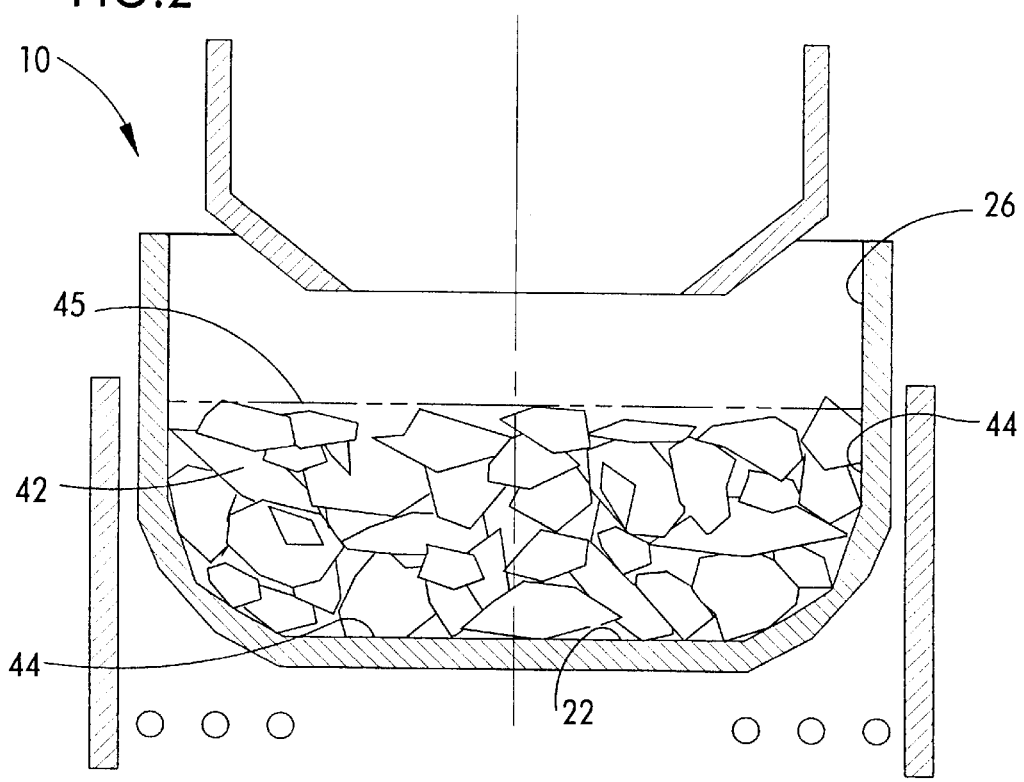
FIG. 2 is a sectional view of a Czochralski crucible, showing an initial charge of chunk polysilicon.

Referring now to FIG. 2, the amount of chunk polysilicon 42 initially loaded into the crucible 10 is generally optimized with respect to the quality of the single crystal silicon ingot and production throughput. For example, as stated above, if too much chunk polysilicon is loaded into the crucible, mechanical stress on the crucible increases. In addition, there is also an increase in the probability of the charge shifting, or forming bridges or hangers. Therefore, to limit the potential for crucible damage resulting from shifting of the charge, the initial charge of chunk polysilicon is preferably arranged in the crucible 10 such that flat sides 44 of the chunk are adjacent the bottom 22 and/or sidewall 26 of the crucible. Such an arrangement is preferred in order to decrease the likelihood that, if the chunks of polysilicon shift, the points of the chunk collide with the sidewall or bottom of the crucible and cause damage.

It is also to be noted that the initial loading size of chunk polysilicon may vary with crucible design, hot zone design and the types of crystal products being produced. For example, for a 100 kg total charge using a 22 inch crucible, an initial loading of chunk polysilicon of about 50 to 65 kg is preferred, with a loading of about 55 kg being most preferred. In contrast, for a 120 kg total charge using a 24 inch crucible, an initial loading of about 50 to 70 kg is preferred, with a loading of about 55 kg being most preferred. As a result, as depicted in FIG. 2, for a given crucible, hot zone, or crystal product, chunk polysilicon 42 will typically be initially loaded such that the height of the charge does not exceed the total height of the silicon melt, as generally indicated by line 45, once preparation of the silicon melt is complete. It is to be noted in this regard that, due to the irregularity in the shape of the chunk polysilicon, the general height of the charge is to be determined by measuring from the bottom 22 of crucible 10 to the highest point at the of the chunk polysilicon charge.

The chunk polysilicon is loaded in this way in order to limit the potential for the formation of hangers or bridges. Accordingly, the chunk polysilicon is arranged such that the height of the charge ranges from about 0.6 to about 1 times the height of the total silicon melt. Preferably, the chunk polysilicon is arranged such that the height of the charge ranges from about 0.7 to about 0.8 times the height of the total silicon melt.

Figure 3:
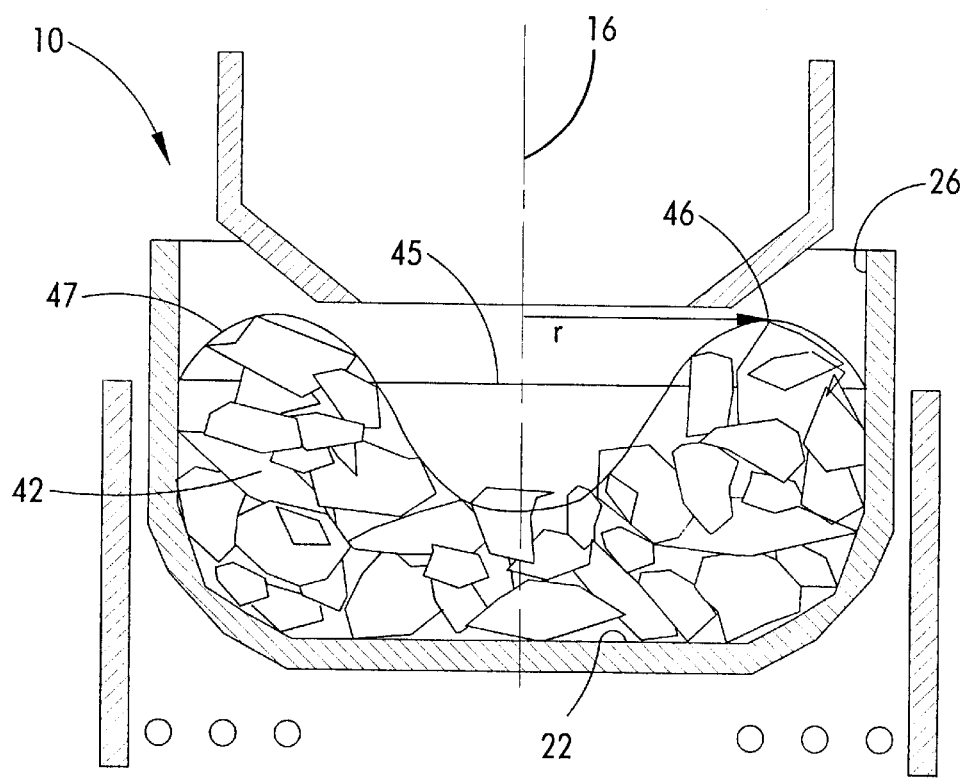
FIG. 3 is a sectional view of a Czochralski crucible, showing chunk polysilicon arranged to form a bowl-shaped charge.

Referring now to FIG. 3, once the charge has been arranged in the crucible 10, chunks of the polysilicon are removed from the center of the charge and stacked toward the sidewall 26 of the crucible such that the charge has a bowl-like or nest-like shape. Stated another way, the chunk polysilicon 42 is arranged such that initially the charge, moving away from the centerline 16 and toward the crucible sidewall 26, generally slopes radially upwardly and outwardly to an apex, at which point the charge generally slopes radially downwardly and outwardly. The initial upward slope, as well as the latter downward slope, of the charge is generally equal to the angle of repose of the chunk polysilicon. An annular rim, generally indicated at 46, is formed by the apex of the bowl-shaped charge arrangement.

It is to be noted that, in arranging the bowl-shaped charge, the height of the charge at the crucible sidewall 26 preferably does not exceed the ultimate height of the melt, indicated generally by line 45, once formation of the molten polysilicon melt is complete. It is preferred that the height of the charge at the sidewall does not exceed the height of the melt in order to prevent the formation of a hanger or a bridge as melting of the charge proceeds.

It is also to be noted that, due to the irregular shape of the chunk polysilicon 42, the surface of the charge is not uniform, which means the slope of the charge will vary somewhat from one particular section of the charge to another. As a result, a best-fit line 47 is meant to approximate the general slope of the bowl-shaped charge. However, the exact slope of the charge can be other than that generally depicted herein by line 47 without departing from the scope of the present invention.

The annular rim 46 of the bowl-shaped charge has a radius, r, as measured radially outwardly from the centerline 16 toward the crucible sidewall 26, which generally ranges from about five-tenths to about nine-tenths R, the radius of the crucible. Preferably, the rim has a radius which ranges from about six-tenths to about eight-tenths of the radius of the crucible. However, due to the irregular shape of the chunk polysilicon 42, the actual radius of the rim 46 may vary somewhat, depending upon the annular position on the rim which is used as the point of reference. Therefore, the radius is to be determined by measuring from the centerline 16 radially outwardly to a point at the apex of the bowl-shaped charge which is farthest from the centerline.

Generally, the height of the bowl-shaped charge at the annular rim 46 is greater than the height of the charge at or proximate the centerline 16. Typically, the ratio of the height of the annular rim to the height at or proximate the centerline will range from about 3.5:1 to about 1.25:1, and preferably from about 3:1 to about 2.5:1. For example, for a 22 inch diameter crucible and a 100 kg charge, the height of the bowl-shaped charge at the annular rim 46 ranges from about 18 cm to about 25 cm, and preferably from about 22 cm to about 25 cm, as measured from the bottom 22 of the crucible 10. The height of the charge at or proximate the centerline 16 generally ranges from about 8 cm to about 16 cm, and preferably from about 8 cm to about 10 cm, also as measured from the bottom of the crucible. In addition, preferably the rim extends from about 6 cm to about 12 cm, and more preferably from about 10 cm to about 12 cm, above the charge at or proximate the centerline 16.

It is to be noted that the height of the charge at the annular rim and the height of the charge at or proximate the centerline may vary with the diameter of the crucible, the size of the charge and the design of the hot zone. For example, as the diameter of the crucible increases the depth of the bowl-shaped charge, i.e. the distance the rim extends above the charge at or proximate the centerline, may increase, provided the design of the hot zone is not prohibitive. As a result, it is to be understood that the height of the charge at the annular rim, and at or proximate the centerline, may be other than that herein describe without departing from the scope of the present invention.

It is also to be noted that the height of the charge at the rim 46 and at the centerline 16 may vary somewhat due to the irregular shape of the chunk polysilicon 42. As a result, the height of the charge at the rim and at, or proximate, the centerline is to be determined by measuring the distance between a point of the charge which is highest at the rim, or at or proximate the centerline, and the bottom 22 of the crucible 10. In addition, the distance the rim extends above the charge at the centerline is to be determined by measuring the distance between the highest point of the charge at or proximate the centerline to the highest point of the charge at the rim.

Figure 4:
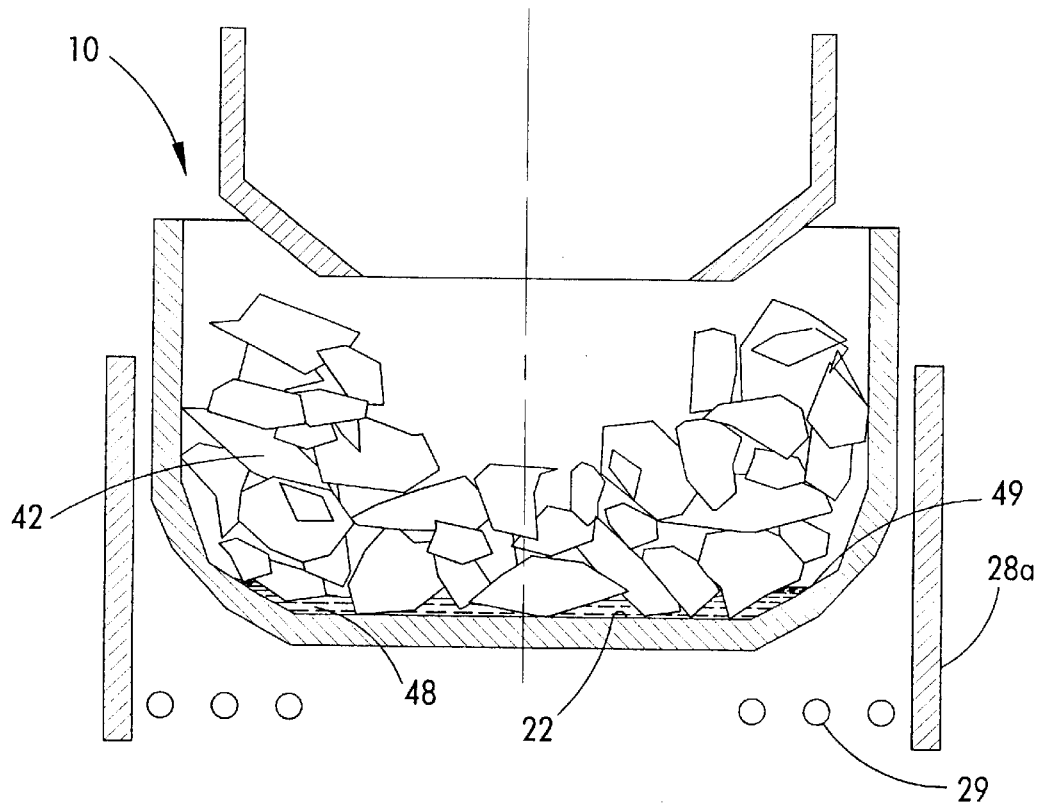
FIG. 4 is a sectional view of a Czochralski crucible, showing the formation of a partially melted charge.

Referring now to FIG. 4, the chunk polysilicon 42 is heated by positioning the crucible 10 such that the charge is generally centered within the cylindrical side heater 28a. It is to be noted in this regard that the precise location of the crucible will vary with the design of the crucible and hot zone being used, as well as the size of the initial chunk polysilicon load. The chunk polysilicon 42 is heated until it begins to melt, forming a partially melted charge comprising both a layer of molten silicon 48, having an upper surface 49, and unmelted chunk polysilicon 42 which is exposed above the upper surface of the molten silicon melt. The rate of heating is controlled such that a layer of molten silicon 48 sufficient to cover the crucible bottom 22 is formed by melting between about 4 and 10 percent by weight, and preferably between about 6 and 8 percent by weight, of the chunk polysilicon. An initial heater power is selected for side heater 28a and bottom heater 29 in order to ensure that the formation of the partial silicon melt is achieved by heating the charge typically over a period of about 60 to about 120 minutes, and preferably over a period of about 85 to about 95 minutes.

Referring now to FIG. 5, once a layer of molten silicon 48 has formed at the bottom 22 of the crucible 10, a mixed charge is formed by feeding granular polysilicon 52 via a feed tube 54, which is positioned above a centrally located opening 56 in the reflector 40, onto the exposed unmelted chunk polysilicon 42. Prior to and during charging of the granular polysilicon, the feed tube is movably positioned over the center of the crucible 10 and directly above the center of the bowl-shaped charge. The granular polysilicon is fed generally into the center, or bottom, of the bowl-shaped chunk polysilicon charge proximate the centerline 16 of the crucible 10. The feed tube 54 has a nozzle 55 which generally has a length selected in order to ensure that, after the addition of granular polysilicon addition is complete, the end of the nozzle is about 1 to about 2 cm from the top of the granular polysilicon mound which has formed. Typically, the nozzle has a length ranging from about 8 cm to about 12 cm. The nozzle 55 acts in conjunction with the walls of the bowl-shaped charge to reduce the amount of granular polysilicon which bounces off the bottom of the bowl-shaped charge and out of the crucible during this addition.

The granular polysilicon is fed onto the charge at a rate which varies, depending upon the diameter of the crucible being used and the total size of the polysilicon charge, including both chunk and granular. For example, for a 20 inch or 22 inch diameter crucible and about a 75 kg to about 100 kg charge, typically the granular polysilicon will be fed at a rate ranging from about 15 to about 25 kg/hr, and preferably at a rate ranging from about 19 to about 21 kg/hr. For a 24 inch diameter crucible and about a 120 kg to about 140 kg charge, typically the feed rate will range from about 20 to about 30 kg/hr, and preferably from about 24 to about 26 kg/hr. For a 32 inch diameter crucible and about a 150 kg charge or more, typically the feed rate will range from about 40 to about 60 kg/hr.

The weight ratio of chunk polysilicon initially loaded to the granular polysilicon being fed onto the unmelted chunk ranges from about 1:2 to about 2:1 and, preferably, from about 2:3 to about 3:2. For example, for a 100 kg total charge in a 22 inch crucible, about a 55 kg loading of chunk polysilicon is most preferred based on the factors detailed above, with the balance of the total charge being granular polysilicon.

Formation of a layer of molten silicon in the bottom of the crucible prior to the addition of granular polysilicon acts to prevent argon gas, present at the bottom of the crucible, from being trapped. This is because, as the heating process begins, argon can escape through spaces or channels, indicated generally at 60, which exist between the chunks of polysilicon charged to the crucible. It is therefore important not to begin the addition of the granular polysilicon until a layer of molten silicon has formed, because the polysilicon will fill these spaces, trapping the Argon and prevent its escape.

During the initial period of granular polysilicon addition, pressure within the crystal puller is typically maintained at about 1 torr. This pressure is maintained for about 160 to about 200 minutes, and preferably for about 170 to about 190 minutes. Maintaining this pressure within the crystal puller acts to reduce the amount of Argon that can be trapped at the bottom of the crucible. By allowing the Argon gas to escape, voids are not formed in the single crystal silicon ingot during the growth process.

Referring now to FIG. 6, during the initial stage of forming the mixed charge of granular and chunk polysilicon, the granular polysilicon 52 is fed into the bottom of the bowl-shaped charge. It then passes, or "trickles," through the spaces 60 that exist between the chunks of polysilicon, due to the irregular shape of the chunks, until it reaches the molten silicon 48 at the bottom 22 of the crucible 10. The bowl-shaped charge acts to funnel the granular polysilicon toward the bottom of the crucible and also acts to prevent the spaces between the chunk polysilicon from becoming clogged or filled before the granular polysilicon reaches the bottom.

As previously stated, as the granular polysilicon 52 is heated to the point of melting, hydrogen contained within the granular polysilicon is released. If the granular polysilicon comes into contact with the molten silicon too soon, the temperature of the granular polysilicon will be increased rapidly, resulting in the rapid release of the hydrogen it contains. This rapid release of hydrogen can result in the splattering of molten silicon. As generally depicted at 62 in FIG. 6, the unmelted chunks of polysilicon present above the surface of the molten silicon act to deflect the splattered droplets of molten silicon, thus preventing them from escaping the crucible and becoming attached to other areas within the hot zone above the crucible, such as the reflector 40 or the feed tube 54.

Referring now to FIG. 7, as the feeding of granular polysilicon 52 continues, eventually a sufficient quantity is added in order to fill the spaces 60 which are present between the chunks of polysilicon present at the bottom 22 of the crucible 10. As a result, the granular polysilicon accumulates on top of the mixed polysilicon charge, forming a granular polysilicon cap 64 which extends radially outwardly and downwardly from the centerline 16 to cover the chunk and granular polysilicon beneath it. It is to be noted in this regard that generally the granular polysilicon comprising the cap is that which is present at or above line 30, the line denoting the division between the top portion 26(a) and bottom portion 26(b) of sidewall 26. Stated another way, generally the granular polysilicon cap is in contact with the top portion of the sidewall.

Preferably, through out crucible loading and formation of the silicon melt the crucible 10 is maintained at a position which generally centers the chunk polysilicon charge within the side heater 28a. However, due to the formation of the granular polysilicon cap 64, the crucible 10 may need to be lowered in order to prevent the cap from coming into contact with the reflector 40. If the crucible 10 must be lowered, preferably it will be position such that the top edge 18 remains at or above the top edge 28a of the side heater 28a. It is to be noted in this regard that whether the crucible must be lowered and, if so, to what level it must be lower are dictated by the crucible design, the hot zone design, and the size of the charge. As a result, these factors may dictate that top edge 18 of the crucible 10 fall below the top edge 28b of the side heater 28a in order to prevent the polysilicon cap 64 from contacting the reflector 40. If this occurs, the crucible should be raised as soon as a sufficient quantity of polysilicon charge has melted to prevent the cap from contacting the reflector.

Figure 8:
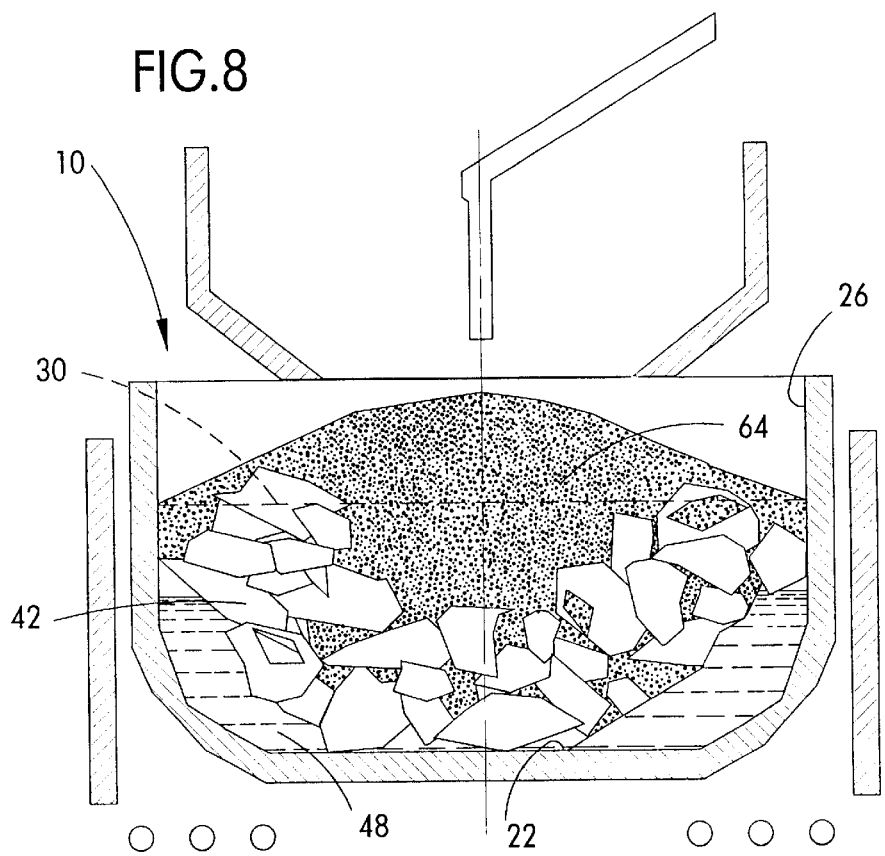
FIG. 8 is a sectional view of a Czochralski crucible, showing the completion of granular polysilicon addition and the formation of the granular polysilicon cap.

Referring now to FIG. 8, feeding of the granular polysilicon continues until the balance of the charge has been added to the crucible. For example, for a 100 kg total charge with an initial charge of about 55 kg of chunk polysilicon, feeding is continued until the balance of about 45 kg of granular polysilicon is added. The balance of the granular polysilicon accumulates on top of the mixed polysilicon charge and adds to the general size, shape and slope of the granular polysilicon cap 64, formed by the granular polysilicon which is generally in contact with the top portion 26(a) of the sidewall 26 and above line 30. The final slope of the granular polysilicon comprising the cap is generally equal to the angle of repose for the granular polysilicon being added. As the mixed polysilicon charge continue to melt in the bottom 22 of the crucible 10, both the unmelted chunk 42 and granular polysilicon cap 64 above the molten silicon 48 act as a shield to deflect any molten silicon droplets that may be splattered due to the rapid release of hydrogen, thus preventing the droplets from escaping the crucible.

Figure 9:
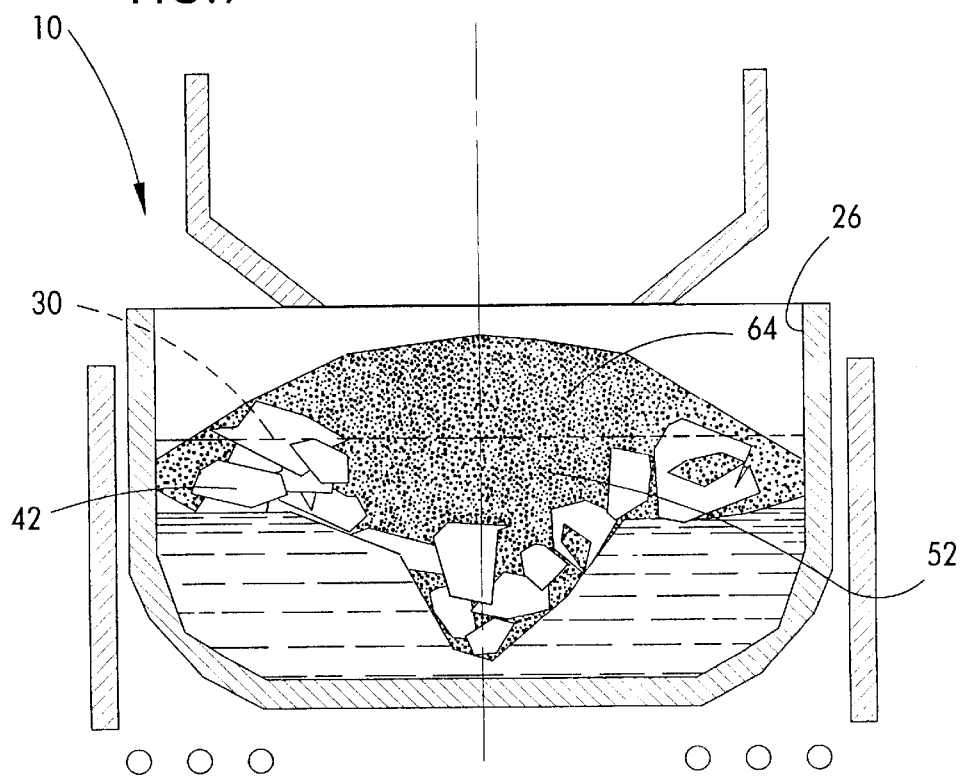
FIG. 9 is a sectional view of a Czochralski crucible, showing the continued melting of the granular and chunk polysilicon.

After the addition of granular polysilicon is complete, heater power is monitored in order to control the rate at which the granular polysilicon cap 64 melts. Referring now to FIG. 9, heater power is maintained within this range in order to ensure that the mixed charge of chunk 42 and granular 52 polysilicon beneath the cap 64, i.e. the polysilicon present at or below line 30 and generally in contact with the bottom portion 26(b) of sidewall 26, melt at a rate that allows the cap to gently enter the molten silicon melt such that the splashing of molten silicon onto the crucible wall or overhanging hot zone parts is prevented. Stated another way, heater power is maintained in order to control the rate at which the granular polysilicon comprising the cap, i.e. the polysilicon generally in contact with the top portion of the sidewall, enters the silicon melt. Typically, the polysilicon melts at a rate that allows the cap to gently enter the silicon melt over a period ranging from about 60 to about 120 minutes, preferably over a period ranging from about 75 to about 105 minutes, and most preferably over a period of about 90 minutes.

Figure 10:
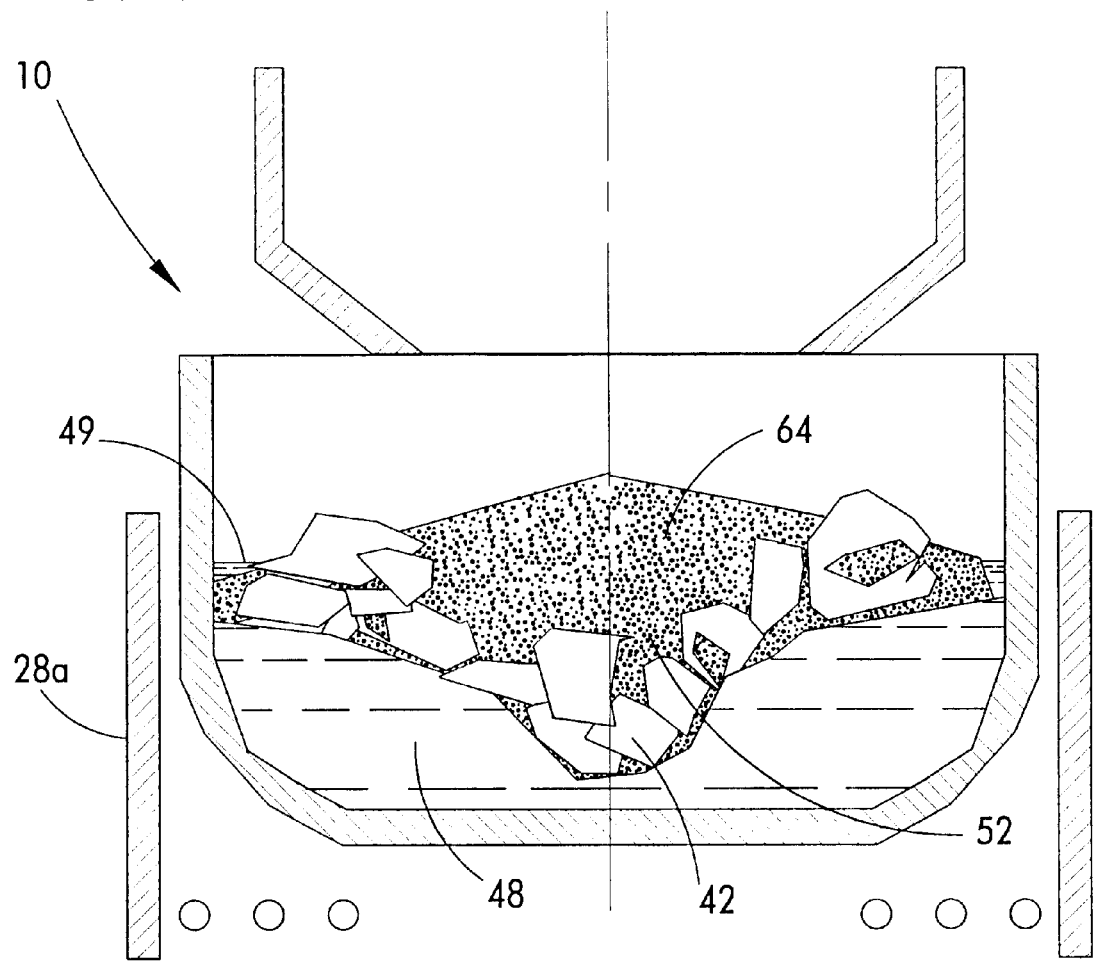
FIG. 10 is a sectional view of a Czochralski crucible, showing the granular polysilicon cap entering the molten silicon melt.

Referring to FIG. 10, controlled heating allows for the cap 64 to slowly fall below the upper surface 49 and enter the molten silicon melt 48, thus preventing the cap from falling into the melt and causing molten silicon to be splashed out of the crucible. In this regard, the process of the present invention is particularly suited for crystal pullers having hot zones of complex design. Complex hot zones are preferred because such designs provide greater melt control for the granular polysilicon cap 64, thus limiting the likelihood that molten silicon will be splashed as the cap enters the melt.

As the mixed charge of granular 52 and chunk 42 polysilicon melt beneath the cap 64, the temperature of the unmelted granular polysilicon which comprises the cap increases. By controlling time period over which the cap 64 eventually enters the molten silicon melt, the granular polysilicon which comprises the cap is exposed to temperature levels for a duration which is sufficient to allow for it to be dehydrogenated before it becomes immersed in the molten silicon. Dehydrogenation refers to the diffusion of entrapped hydrogen molecules ($H_2$) or atoms (H) through the crystal structure of the polysilicon. Accordingly, the factors affecting dehydrogenation include the temperature-dependent diffusion constant of hydrogen, the distance through which the hydrogen must diffuse to escape the crystal structure, and time. Generally, for polysilicon chunks or granules of a particular size, as temperature increases the diffusion constant increases and the time required for the hydrogen to diffuse decreases.

Once the polysilicon cap 64 has successfully entered the molten silicon melt 48, the crucible 10 is returned to its initial position, if it was lowered during the addition of granular polysilicon. Again, preferably this means the crucible will be positioned such that the polysilicon charge is centered within the side heater 28*a*.

It is to be noted that the above heater power levels and time ranges can be optimized for charges of any size and crucibles of any diameter using the following empirical guidelines. It is important for the mixed charge of chunk and granular polysilicon beneath the cap to melt at a rate which allows for the cap to slowly enter the melt. If the chunk and granular polysilicon beneath the cap melt too fast, the distance over which the cap must fall into the molten silicon melt may be too great, thus causing molten silicon to splash from the crucible. If this occurs, the total side heater power is too high and should be reduced by about 1 to about 2 kW, both during and after granular polysilicon feeding, when the next silicon melt is prepared.

Conversely, if the chunk and granular polysilicon beneath the cap melt too slow the cap can ultimately form a bridge and separate from the surface of the molten silicon melt, losing the heat conduction path that exits between it and the melt. As a result, if the cap fails to fall into the melt within about 90 to about 100 minutes after feeding of granular polysilicon is complete, about 1 kW should be added to the side heater power. If the cap has failed to fall into the melt after about 120 minutes after feeding is complete, about 2 kW of additional power should be added. If the cap has not fallen into the melt after about 150 minutes, an additional 2 kW of power should be added.

If the cap has not fallen into the melt after about 180 minutes has elapsed since the feeding of granular polysilicon has been completed, it is likely that a bridge has formed. If this occurs, there is significant potential for the creation of a large molten silicon splash, should the cap break loose from the crucible and fall into the melt. Due to the hazards posed by such a situation, it is preferred to fail the charge and prepare a new melt, wherein the total side heater power is increased by at least about 3 to 4 kW.

In accordance with the process of the present invention, the addition of granular polysilicon to the bowl-shaped chunk polysilicon charge is generally preferred because it is more freely flowing than chunk polysilicon. Preferably, the granular polysilicon is dust free and about 90% of the granules, by weight, have a size distribution falling within the range of about 400 $\mu$m to about 1400 $\mu$m. The hydrogen concentration of the granular polysilicon is not narrowly critical due to the fact that splattering is contained within the crucible by means of the chunk polysilicon and the granular polysilicon cap. Hydrogen concentration is also not narrowly critical due to the fact that the granular polysilicon comprising the cap is allowed to dehydrogenate prior to becoming immersed in the molten silicon melt. Therefore, the present invention is advantageous over prior art methods because it provides a means by which to employ granular polysilicon having a wide range of average hydrogen concentrations, including average concentrations of up to about 200 ppma. Preferably, however, the average hydrogen concentration of the granular polysilicon is less than about 50 ppma, and more preferably less than 20 ppma.

The process of the present invention affords the means by which to reduce the amount of time required to prepare a molten silicon melt, while avoiding the above-mentioned problems which can introduce defects into the growing single crystal silicon ingot, thus improving the overall yield and throughput of dislocation-free single crystal production. For example, the total time required to form a 100 kg molten silicon melt in a given crystal puller have a hot zone of complex design is about 6.5 to about 7.5 hours. It is to be noted that if the cap enters the melt within the time ranges given above, but the time to completely melt the charge exceed 7.5 hours, the power levels for the heaters after about 5.5 hours should be increased when the next melt is prepared by about 1 kW. Conversely, if the time to completely melt the charge is less than about 6.5 hours, the power levels for the heaters after about 5.5 hours should be decreased by about 1 kW.

It is important to note that the rate at which the granular polysilicon is fed into the crucible should be maintained within the ranges given above. If the feed rate falls below the lower limits given, it is likely that too much of the chunk polysilicon may melt prior to the formation of the granular polysilicon cap. If this occurs, molten silicon could splatter from the crucible because there is not a enough chunk polysilicon to deflect the molten silicon as hydrogen escapes from the melting granular polysilicon. Conversely, if the feed rate exceeds the upper limits given, an increase in the heater power may be required in order to melt the charge. An increase in heater power could cause the mixed charge of granular and chunk polysilicon beneath the cap to melt to quickly, resulting in the splattering of molten silicon as the cap enters the melt.

What is claimed is:

1. A process for preparing a silicon melt for use in growing a single crystal silicon ingot in accordance with the Czochralski method, the silicon melt being prepared in a crucible having a bottom, a sidewall, a centerline which is substantially parallel to the sidewall and intersects a geometric centerpoint of the bottom, and a radius extending from the centerline to the sidewall, the process comprising loading chunk polysilicon into the crucible to form a charge having a bowl-like shape, wherein the load generally slopes radially upwardly and outwardly from the centerline toward the sidewall to an apex and then slopes generally downwardly and outwardly from the apex to the sidewall;

heating the bowl-shaped chunk polysilicon charge to form a partially melted charge;

feeding granular polysilicon onto the bowl-shaped, partially melted charge to form a mixed charge of granular and chunk polysilicon; and heating the mixed polysilicon charge to form a silicon melt.

2. The process as set forth in claim 1 wherein the granular polysilicon is fed onto the bowl-shaped partially melted charge proximate the centerline.

3. The process as set forth in claim 1 wherein the bowl-shaped chunk polysilicon charge has a height at the sidewall which is not greater than a height of the silicon melt after the mixed polysilicon charge has melted.

4. The process as set forth in claim 1 wherein the apex generally forms an annular rim of the bowl-shaped chunk polysilicon charge.

5. The process as set forth in claim 4 wherein the annular rim has a radius, as measured radially outwardly from the centerline toward the crucible sidewall, ranging from about six-tenths to about eight-tenths the radius of the crucible.

6. The process as set forth in claim 4 wherein the annular rim has a height ranging from about from about 22 cm to about 25 cm, as measured from the bottom of the crucible.

7. The process as set forth in claim 4 wherein a ratio of the height of the annular rim to the height of the charge proximate the centerline ranges from about 3:1 to about 2.5:1.

8. A process for preparing a silicon melt in a crucible for use in growing a single crystal silicon ingot in accordance with the Czochralski method, the silicon melt being prepared in a crucible having a bottom, a sidewall, a centerline which is substantially parallel to the sidewall and intersects a geometric centerpoint of the bottom, and a radius extending from the centerline to the sidewall, the process comprising loading chunks of polysilicon into a crucible;

heating the chunks of polysilicon to form a partially melted charge comprising molten silicon having an upper surface and unmelted chunks of polysilicon exposed above the upper surface of the molten silicon;

feeding granular polysilicon onto the exposed, unmelted chunks of polysilicon to form a mixed polysilicon charge, a portion of the granular polysilicon passing through spaces present between the unmelted chunks of polysilicon until the granular polysilicon contacts the molten silicon; and heating the mixed polysilicon charge to form a silicon melt, the unmelted chunks of polysilicon exposed above the upper surface of the molten silicon acting to deflect splatters of molten silicon caused by the escape of hydrogen as the granular polysilicon contacts the molten silicon and melts.

9. The process as set forth in claim 8 wherein the partially melted charge is formed prior to the addition of granular polysilicon in order to prevent the formation of void defects in the single crystal silicon ingot.

10. The process as set forth in claim 8 wherein the partially melted charge is formed by melting from about 6 to about 8 percent by weight of the chunk polysilicon.

11. The process as set forth in claim 8 wherein the chunk polysilicon is loaded into the crucible to form a charge having a bowl-like shape, wherein the load generally slopes radially upwardly and outwardly from the centerline toward the sidewall to an apex and then slopes generally downwardly and outwardly from the apex to the sidewall.

12. The process as set forth in claim 11 wherein the granular polysilicon is fed onto the bowl-shaped chunk polysilicon charge proximate the centerline.

13. The process as set forth in claim 11 wherein the bowl-shaped chunk polysilicon charge has a height at the sidewall which is not greater than a height of the silicon melt after the mixed polysilicon charge has melted.

14. The process as set forth in claim 11 wherein the apex generally forms an annular rim of the bowl-shaped chunk polysilicon charge.

15. The process as set forth in claim 14 wherein the annular rim has a radius, as measured radially outwardly from the centerline toward the crucible sidewall, ranging from about six-tenths to about eight-tenths the radius of the crucible.

16. The process as set forth in claim 14 wherein a ratio of the height of the annular rim to the height of the charge proximate the centerline ranges from about 3:1 to about 2.5:1.

17. A process for preparing a silicon melt in a crucible for use in growing a single crystal silicon ingot in accordance with the Czochralski method, the silicon melt being prepared in a crucible having a bottom, a sidewall having a top portion and a bottom portion, a centerline which is substantially parallel to the sidewall and intersects a geometric centerpoint of the bottom, and a radius extending from the centerline to the sidewall, the process comprising loading chunk polysilicon into a crucible;

heating the chunk polysilicon to form a partially melted charge comprising molten silicon having an upper surface and unmelted chunk polysilicon exposed above the upper surface of the molten silicon;

feeding granular polysilicon onto the exposed unmelted chunk polysilicon to form a mixed polysilicon charge, the granular polysilicon accumulating on top of the mixed polysilicon charge and forming a granular polysilicon cap; and, melting the mixed polysilicon charge to form a silicon melt.

18. The process as set forth in claim 17 wherein the granular polysilicon cap is generally in contact with the top portion of the sidewall after feeding of the granular polysilicon is complete.

19. The process as set forth in claim 17 wherein the granular polysilicon cap is present above the upper surface of the molten silicon and acts to deflect splatters of molten silicon caused by the escape of hydrogen as granular polysilicon contacts the molten silicon and melts.

20. The process as set forth in claim 18 wherein the mixed polysilicon charge melts at a rate which allows the granular polysilicon cap to enter the silicon melt about 75 minutes to about 105 minutes after the addition of granular polysilicon is completed.

21. The process as set forth in claim 18 wherein granular polysilicon comprising the granular polysilicon cap is allowed to dehydrogenate prior to contacting the surface of the silicon melt.

* * * * *

UNITED STATES PATENT AND TRADEMARK OFFICE
CERTIFICATE OF CORRECTION

PATENT NO. : 5,919,303  
DATED : July 6, 1999  
INVENTOR(S) : John Davis Holder

Page 1 of 1

It is certified that error appears in the above-identified patent and that said Letters Patent is hereby corrected as shown below:

<u>Column 13, Claim 6,</u>
Line 4, please delete the first instance of "from about".

<u>Column 14, Claim 20,</u>
Line 45, please change "18" to read -- 17 --.

<u>Column 14, Claim 21,</u>
Line 50, please change "18" to read -- 17 --.

Signed and Sealed this

Twenty-first Day of August, 2001

Attest:

*Nicholas P. Godici*

NICHOLAS P. GODICI
*Acting Director of the United States Patent and Trademark Office*

*Attesting Officer*